(12) United States Patent
Fischer et al.

(10) Patent No.: US 6,659,355 B1
(45) Date of Patent: Dec. 9, 2003

(54) METHOD FOR PRODUCING A MULTI-LAYER CHIP CARD

(75) Inventors: Dirk Fischer, Paderborn (DE); Lothar Fannasch, Bielefeld (DE)

(73) Assignee: ORGA Kartensysteme GmbH, PaderBorn (DE)

( * ) Notice: Subject to any disclaimer, the term of this patent is extended or adjusted under 35 U.S.C. 154(b) by 0 days.

(21) Appl. No.: 10/049,840

(22) PCT Filed: Aug. 1, 2000

(86) PCT No.: PCT/DE00/02559
§ 371 (c)(1),
(2), (4) Date: May 30, 2002

(87) PCT Pub. No.: WO01/15074
PCT Pub. Date: Mar. 1, 2001

(30) Foreign Application Priority Data

Aug. 19, 1999 (DE) .......................... 199 39 347

(51) Int. Cl.⁷ .............................. G06K 19/06
(52) U.S. Cl. ................. 235/492; 235/451; 235/487
(58) Field of Search ................ 235/492, 487, 235/451

(56) References Cited

U.S. PATENT DOCUMENTS

| | | | | |
|---|---|---|---|---|
| 5,917,705 A | * | 6/1999 | Kirschbauer et al. | 361/737 |
| 5,969,951 A | | 10/1999 | Fischer et al. | |
| 6,137,687 A | * | 10/2000 | Shirai et al. | 361/749 |
| 6,283,378 B1 | * | 9/2001 | Welling | 235/492 |
| 6,293,470 B1 | * | 9/2001 | Asplund | 235/487 |
| 6,375,083 B2 | * | 4/2002 | Fries et al. | 235/492 |
| 6,412,702 B1 | * | 7/2002 | Ishikawa et al. | 235/492 |
| 6,459,588 B1 | * | 10/2002 | Morizumi et al. | 361/737 |
| 6,467,692 B1 | * | 10/2002 | Tarantino et al. | 235/492 |

FOREIGN PATENT DOCUMENTS

| DE | 197 35 170 A1 | 9/1998 |
|---|---|---|
| EP | 0 869 453 A2 | 10/1998 |

* cited by examiner

Primary Examiner—Karl D. Frech
Assistant Examiner—Allyson Sanders
(74) Attorney, Agent, or Firm—Foley & Lardner

(57) ABSTRACT

Disclosed is a method for producing a chip card which is provided with a plastic card body (1) comprising several layers, an integrated circuit that is arranged in a chip module (2) and at least two additional electronic components (3,4) for producing an interactive chip card. The components and the chip module are connected to each other by means of strip conductors (4, 5, 9) which are arranged on a carrier layer (8) and metallic contact surfaces (7) which are connected to the conductors. According to the invention, several cover layers (10, 11) are mounted on the conductor carrier layer. Said cover layers are provided with recesses (15, 16, 15', 16') corresponding to the metallic contact surfaces (7). The individual card layers of the plastic card body (1) are laminated and as a result the metallic contact surfaces (7) are pushed upwards within the recesses (15, 16, 15', 16') of the cover layers (10, 11) to a point where said contact surfaces rest on a cover layer (10) or a thickness compensation layer (12), whereby said recesses are arranged above the contact surfaces. Three-dimensional conductor carrier layers (8) can be easily produced by means of the inventive method in such a way that electronic components of different thicknesses can be introduced into the chip card body without entailing problems.

17 Claims, 4 Drawing Sheets

METHOD FOR PRODUCING A MULTI-LAYER CHIP CARD

BACKGROUND OF THE INVENTION

1) Field of the Invention

The invention relates to a method for producing a chip card, which has a multi-layer plastic card body, an integrated circuit arranged in a chip module and at least two further electronic components, which are connected to one another and/or to the chip module by strip conductors arranged on a carrier layer and metallic contact surfaces connected to the strip conductors, and also relates to a chip card produced by the generic method.

2) Description of the Related Art

Chip cards are being used to an increasing extent in the form of phone cards, access authorization cards, bank cards etc. In the case of these cards, the energy supply and data exchange of the card with external equipment takes place in a direct way via physical contact or in an inductive way by a coil embedded in the card. In the case of cards of this type, only a connection between the chip module and the coil embedded in the card body has to be established in the course of the production process.

Apart from these cards of a relatively simple construction, the increased possibilities for using chip cards are leading also to the design of chip cards which have further electronic components, such as for example a keypad and a display, and are referred to as interactive chip cards. The additional components may have different overall heights, on account of which the connection between the keypad, display and integrated circuit within the chip card has to be brought about in a relatively complicated way.

It is therefore an object of the present invention to develop further the generic method for producing a chip card and a chip card produced by the method in such a way that it is also possible to produce interactive chip cards in a simple way, and consequently at particularly low cost.

This object is achieved in connection with the generically determinative method steps described below. Further advantageous and expedient refinements of the method are also disclosed. An explanation of individual method steps is provided below with reference to the drawings.

DETAILED DESCRIPTION OF A PREFERRED EMBODIMENT

Figure 1:
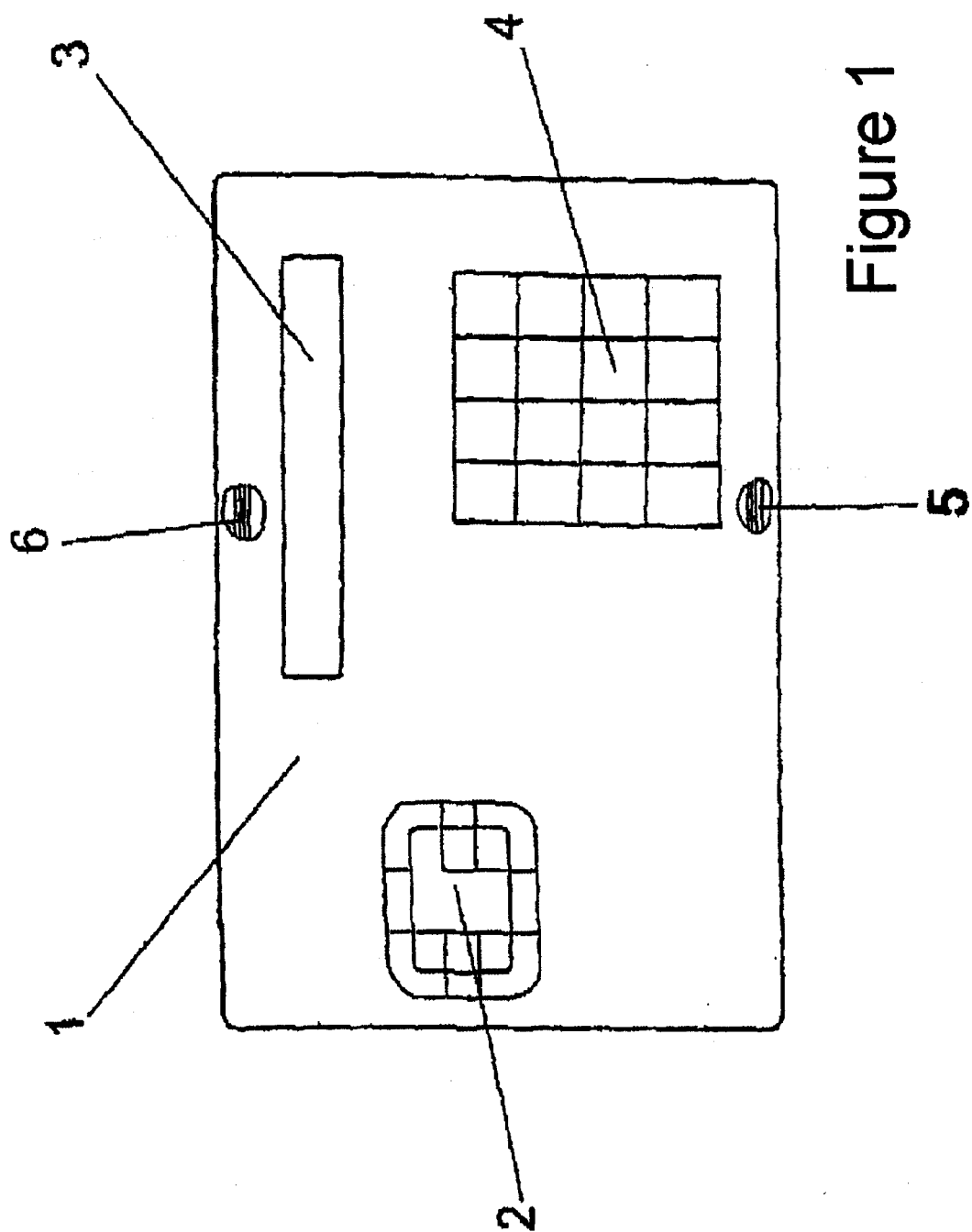
FIG. 1 shows a plan view of a chip card according to the invention, the surface being interrupted at two locations to make the carrier layer for the strip conductors visible.

The chip card produced by the method according to the invention comprises a multi-layer plastic card body 1, in which a chip module 2 and, as further electronic components, a display 3 and a keypad 4 have been inserted. With the aid of the keypad 4, it is possible using the display 3 as a monitor to enter information which is processed in the chip module 2 and can be passed on to external equipment either directly via contact surfaces on the chip module or indirectly via a coil embedded within the plastic card body 1. In FIG. 1, the surface of the chip card is interrupted at two locations, in order to illustrate strip conductors 5, 6, which are arranged within the chip card on a carrier layer and in the figure take the form of the coil for data transmission. The chip module 2, the display 3 and the keypad 4 are connected to the strip conductors by metallic contact surfaces 7, which have a very much greater extent than the remaining strip conductors within the chip card. Strip conductors and metallic contact surfaces 7 are arranged on a common strip conductor carrier layer 8. The production of the strip conductor layer usually takes place by etching out the contact surfaces 7 and the strip conductors from a layer of plastic coated such that it is electrically conductive (preferably with copper).

For producing the interactive chip card represented in FIG. 1, the method according to the invention then provides for seven individual layers to be laminated to form a plastic card body 1. For this purpose, firstly two covering layers 10 and 11 are placed over the strip conductor carrier layer 8 on the upper side of the latter, which is facing the electronic components and the chip module and on which the strip conductors 9 and the metallic contact surfaces 7 are located. A thickness compensating layer 12 is placed over the covering layers and an outer layer, on the front side of the card, is placed over said compensating layer as an overlay. On the underside of the strip conductor carrier layer 8, remote from the strip conductors and metallic contact surfaces, a thickness compensating layer 12 and an outer layer 14 are likewise arranged. The thickness compensating layer 12 comprises a printed film of plastic, while transparent overlay films are used for the outer layer 14 to be applied on top of the latter.

Figure 2:
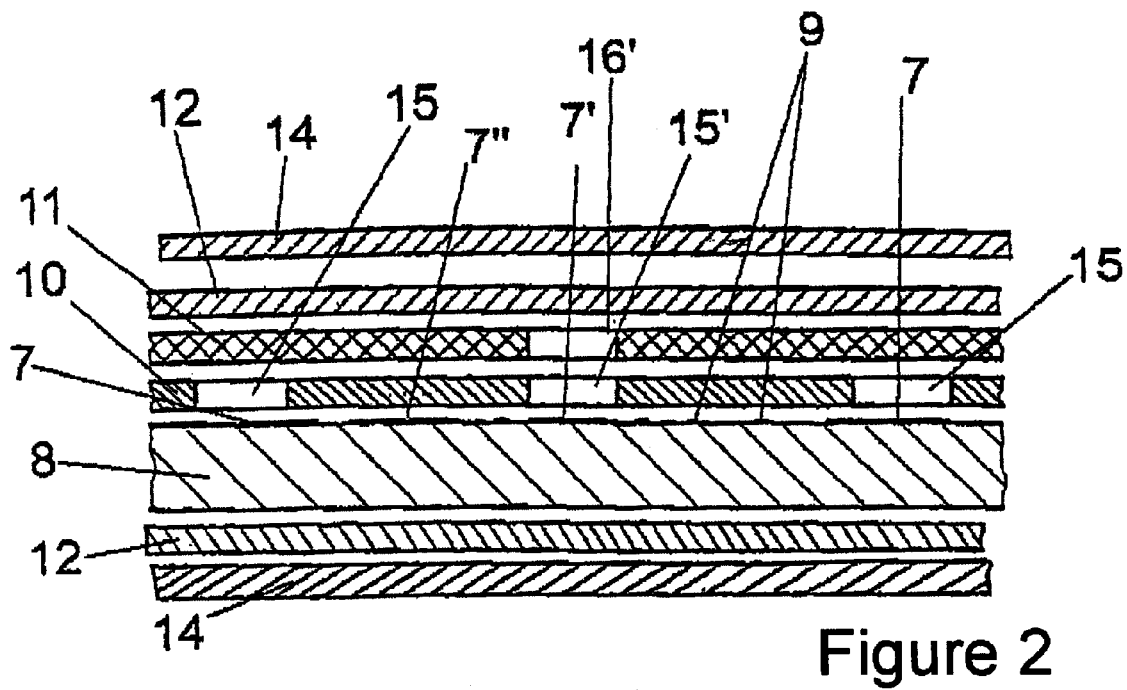
FIG. 2 shows a sectional representation of the individual card layers before lamination in an exploded representation.

As clearly revealed by FIG. 2, the covering layer 10 has a plurality of clearances 15, 15', which correspond in their arrangement within the covering layer 10 to the arrangement of the metallic contact surfaces 7 on the strip conductor carrier layer 8. During the production method, the covering layer 10 is aligned in such a way that the corresponding clearances 15 and 15' lie exactly above the metallic contact surfaces 7.

It is additionally clear from FIG. 2 that the covering layer 11 placed over the covering layer 10 likewise has clearances 16 and 16', which by analogy with those clearances 15, 15' of the covering layer 10 are likewise oriented in their arrangement with the metallic contact surfaces 7 of the conductor track carrier layer 8. However, by contrast with the covering layer 10, the covering layer 11 has no clearance over certain metallic contact surfaces 7. In the course of the production method, the second covering layer 11 is placed over the strip conductor carrier layer 8 in such a way that the corresponding clearances 16' and 15' are arranged over one another and over a metallic contact surface 7'.

Figure 3:
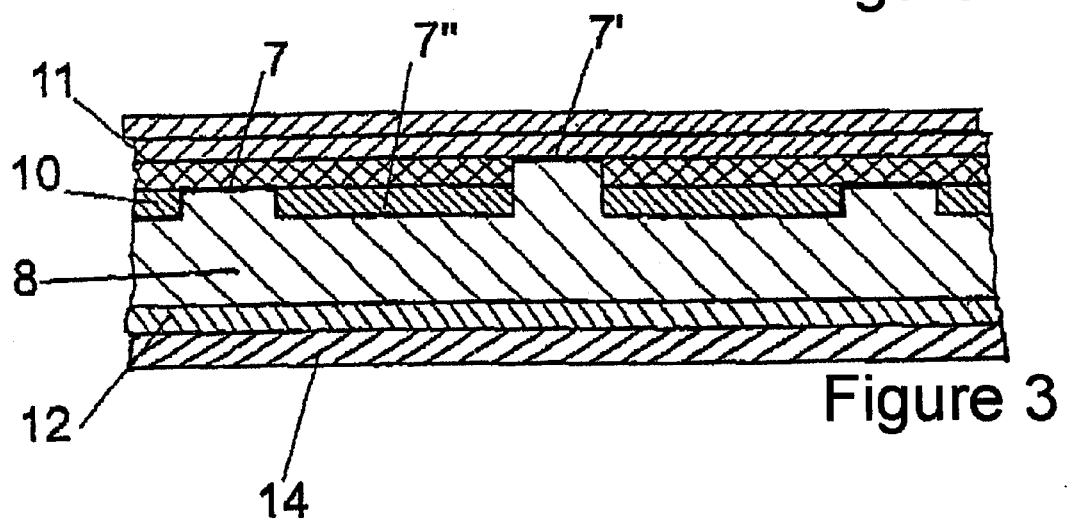
FIG. 3 shows a section through a card after lamination has been completed.

In the production method step which then follows, the seven layers of the plastic card body 1 arranged one on top of the other are laid in a laminating press, in which they are bonded to one another under the influence of pressure and heat. In this laminating process, the metallic contact surfaces 7, 7' are pressed up within the clearances 15 or 15' and 16' arranged over them until they come to bear against a covering layer 11 or a thickness compensating layer 12. The metallic contact surfaces 7, 7' are consequently located with respect to the strip conductor carrier layer 8 on different elevations within the plastic card body 1, as FIG. 3 clearly reveals. The connection between the strip conductors 9 remaining directly on the strip conductor carrier layer 8 and the pressed-up metallic contact surfaces 7 is ensured as before by the ductile material, copper, of the strip conductors. Once the laminating process has been ended, the chip card according to the invention consequently has metallic contact surfaces 7, 7' and 7" on three different levels within the plastic card body 1.

The further production method step following the laminating operation provides for clearances of different depths to be milled into the laminated plastic card body 1, the metallic contact surfaces 7, 7' and 7" located at different depths within the card body being exposed. The raised metallic contact surfaces 7, 7' and 7" ensure during the milling operation that the strip conductors 9 located directly on the strip conductor carrier layer 8 are not damaged during the milling operation.

Once the milling operation has been ended, there are consequently within the plastic card body 1 a plurality of clearances 17 of different depths, into which there can be inserted, apart from the chip module 2, for example, further electronic components, such as for example the display 3 or the keypad 4, which, although of different overall heights, nevertheless do not protrude beyond the surface of the chip card body on account of the production method according to invention. To assist the raising of the metallic contact surfaces 7 and 7', a plastics material with a lower dimensional stability under the influence of pressure and heat than the plastics material for the covering layers 10 and 11 and the thickness compensating layer 12 arranged over the latter is used for the strip conductor carrier layer 8. The lower dimensional stability of the strip conductor carrier layer 8 is manifested by a lower Vicat softening point. This can be brought about for example by dimensionally stabilizing filler articles being admixed with the plastics material, the filler concentration of the strip conductor carrier layer 8 being less than that of the other layers 10, 11, 12, whereby a lower dimensional stability of the strip conductor carrier layer 8 is achieved. In a preferred refinement, the card layers consist of thermally non-recrystallizing polyester (polyethylene terephthalate; PETG). This material is environmentally friendly for recycling or disposal.

Instead of the same card material being used for all the layers of the card, but with a different number of filler particles in the strip conductor carrier layer 8, it may also be provided to use an entirely different plastic for the strip conductor carrier layer 8 than for the covering layers 10, 11 and the thickness compensating layer 12—for example PVC for the strip conductor carrier layer and polycarbonate for the covering layers 10 and 11 and the thickness compensating layer 12. Depending on the type of plastic, the Vicat softening points of PVC lie between approximately 70 and 80° C., while the Vicat softening points of PC, depending on the type, lie between approximately 120 and 130° C. The thickness of the metallic contact surfaces 7 and of the strip conductors 9 is between 20 and 80 µm, whereas the thickness of the covering layers 10, 11 lies in the range between 40 and 200 µm. In any event, the thickness of the metallic contact surfaces 7 is less than the thickness of the covering layers 10 and 11.

For the shaping of the clearances 15, 15' and 16' made in the covering layers 10 and 11, a circular variant has been found to be particularly advantageous; otherwise, rectangular or other outlines of the clearances 15, 15' and 16, 16' are of course also conceivable. The metallic contact surfaces 7 are shaped as rectangular forms, is being possible for the clearances 15, 15', 16, 16' and of the contact surfaces 7 to be arranged both centrally in relation to one another and eccentrically, depending on what is required by the connection of the electronic components to be inserted and the chip module 3.

Figure 4:
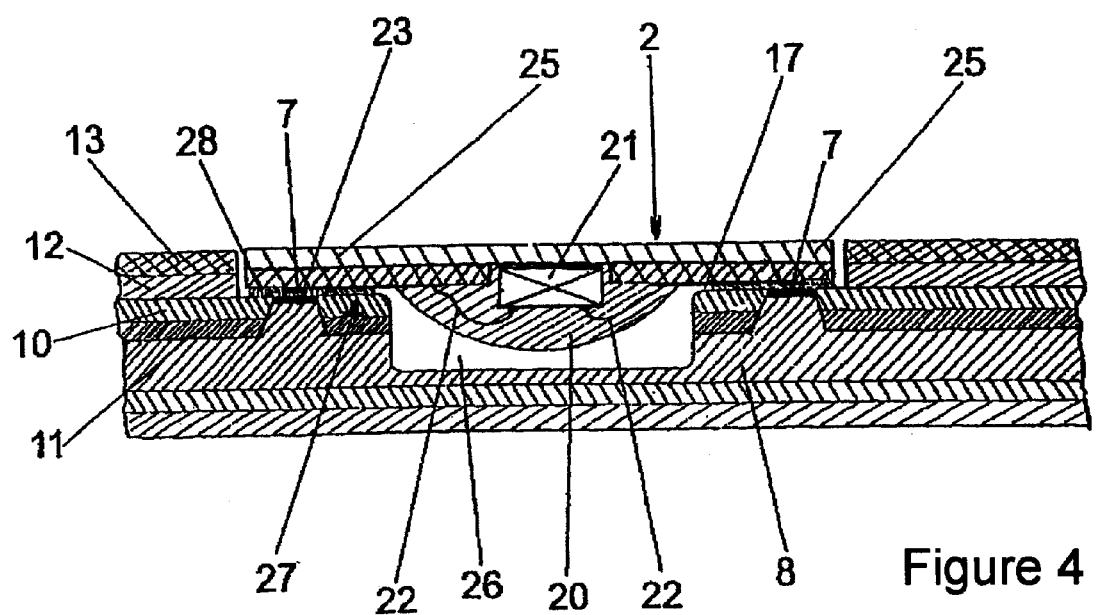
FIG. 4 shows a section through a card after lamination has been completed, with an inserted chip module.

Represented in FIG. 4 in a sectional representation, by way of example, is a clearance 17 within the plastic card body 1, into which clearance a chip module 2 has been inserted. The chip module 2 used for the chip card comprises a first part in the form of a cast housing 20, which has the integrated circuit 21 and the connecting leads 22 from the integrated circuit 21 to the connecting areas 23 for the connection with the metallic contact surfaces 7. In addition, the chip module 2 has a second part 25, which protrudes beyond the edge of the cast housing 20 and has the metallic connecting areas 23 for the connection to the contact surfaces 7.

In a way corresponding to the form of the chip module 2 represented in FIG. 4, the clearance 17 for receiving the chip module 2 within the plastic card body 1 is formed in two stages with an indentation 26 lying centrally in the clearance 17, the metallic contact-surfaces 7 exposed after the milling operation lying on the bearing shoulders 27 of the clearance 17. The chip module 2 is then bonded to the card body 1 at least with its second part 25, protruding beyond the cast housing 20, lying on the milled-out bearing shoulder 27, with an electrically conducting connection being established between the connecting areas 23 of the chip module 2 and the corresponding metallic contact surfaces 7. If very flat chip modules are used, it is also possible, however, to dispense with a two-staged clearance with an additional central indentation. The connection of the connecting areas 23 of the chip module 2 can be connected in an electrically conducting manner by means of an electrically conductive adhesive 28, a soldering process or by welding to the metallic contact surfaces 8. In this case, the electrically conducting connection (for example when using special conductive adhesives) may also suffice for the mechanical fixing of the chip module 2 in the plastic card body 1. However, the chip module 2 is preferably held in the card body by additional adhesive bonds.

Figure 5:
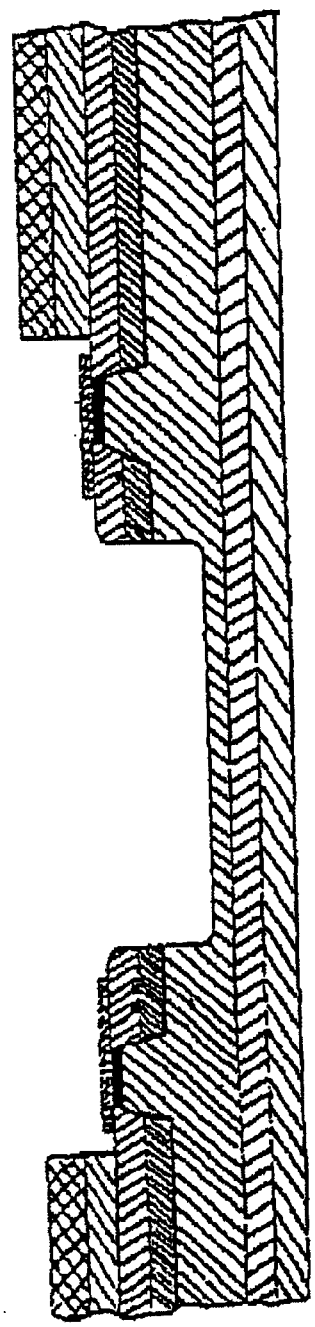
FIGS. 5–7 show sectional representations through a card according to the invention, in which the chip module to be inserted is connected to the contact surfaces of the strip conductor carrier layer and the card in different ways.
Figure 6:
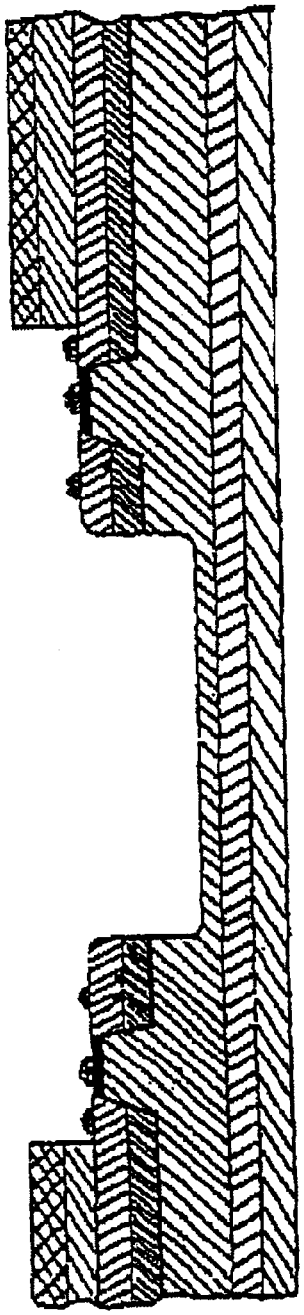
Figure 7:
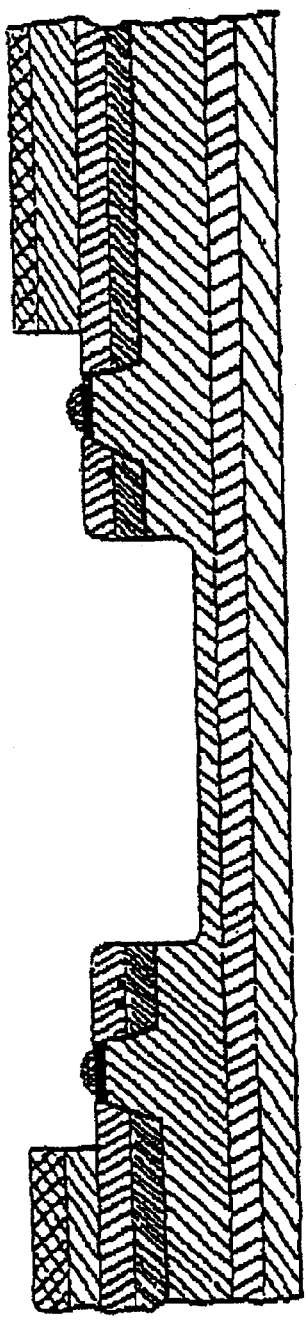

Different types of adhesive application are represented in FIGS. 5 to 7. FIG. 5, for example, shows a possible way of applying the adhesive with a dispenser over the full surface area of a region larger than the exposed metallic contact surfaces 7. This has the advantage that the control effort for the adhesive application remains low, in an advantageous way. By contrast with this, in each of FIGS. 6 and 7 only a drop of the conductive adhesive is applied to the metallic contact surfaces 7, with drops of a non-conductive adhesive being additionally applied to the bearing shoulder 27 of the clearance 17 in FIG. 6 for the secure fixing of the chip module 2 in the card body 1. Of course, the use of a hot-melt adhesive may also be provided for the fixing of the electronic components within the plastic card body 1.

What is claimed is:

1. A method for producing a chip card, which has a multi-layer plastic card body, an integrated circuit arranged in a chip module and at least two further electronic components, which are connected to one another and to the chip module by strip conductors arranged on a carrier layer and metallic contact surfaces connected to the strip conductors, comprising the following method steps:

arrangement of at least two covering layers over the strip conductor carrier layer by the conductor's upper side facing the etectronic components and the chip module, the covering layers each being provided with clearances, positioning of the covering layers over the strip conductor carrier layer in such a way that the clearances located in the individual covering layers are arranged over the metallic contact surfaces and partly over one another, placement of at least one thickness compensating layer covering the covering layers, lamination of the card layers laid one on top of the other in a laminating press under the influence of pressure and heat, the metallic contact surfaces being pressed up within the clearances arranged over the metallic contact surfaces of the covering layers until the metallic contact surfaces come to bear against a covering layer or a thickness compensating layer, milling of clearances of different depths into the laminated plastic card body after removal of the laminated plastic card body from the laminating press, the metallic contact surfaces located within the card body at different depths being exposed, and insertion of the chip module and the other electronic components into the milled clearances of the card body and establishment of electrically conducting connections between the contact surfaces and corresponding connecting areas of the chip module and of the electronic components.

2. The method as claimed in claim 1, wherein the plastics material of the strip conductor carrier layer has a lower dimensional stability under the influence of pressure and heat than the plastics materials of the covering layers and of the thickness compensating layer(s) arranged thereover.

3. The method as claimed in claim 2, wherein the strip conductor carrier layer, the covering layers and the thickness compensating layer consist of the same plastic, the plastic having dimensionally stabilizing filler articles, and the filler concentration of the strip conductor carrier layer, and consequently the dimensional stability of this layer, being less than that of the other layers.

4. The method as claimed in claim 3, wherein the plastic is thermally non-recrystallizing polyester (polyethylene terephthalate; PETG).

5. The method as claimed in claim 2, wherein the strip conductor carrier layer consists of PVC and the covering layers and the thickness compensating layer consist of polycarbonate.

6. The method as claimed in claim 1, wherein the thickness of the metallic contact surfaces on the strip conductor carrier layer is 20–80 $\mu$m.

7. The method as claimed in claim 1, wherein the thickness of the covering layers is 40–200 $\mu$m.

8. The method as claimed in claim 1, wherein the thickness compensating layer, which is arranged on the covering layers has been printed on and a further transparent thickness compensating layer is arranged on the printed thickness compensating layer as an outer card layer.

9. The method as claimed in claim 1, wherein the clearance milled into the card body for receiving the chip module is formed in two stages, with an indentation lying centrally in the clearance and a bearing shoulder surrounding this indentation, the exposed contact surfaces for the chip module being arranged on the bearing shoulder, and a chip module that is used comprising a first part in the form of a cast housing, which has the integrated circuit and the connecting leads from the integrated circuit to the connecting areas for the connection with the metallic contact surfaces, and a second part, which protrudes over the edge of the cast housing and has connecting areas for the connection with the contact surfaces, the chip module being bonded to the card body at least with the second part, protruding beyond the cast housing, lying on the milled-out bearing shoulder, and an electrically conducting connection being established between the connecting areas of the chip module and the contact surfaces of the strip conductor carrier layer.

10. The method as claimed in claim 1, wherein the connecting areas of the chip module are connected to the contact surfaces by means of an electrically conductive adhesive.

11. The method as claimed in claim 1, wherein the chip module is mechanically fixed in the card body by means of the conductive adhesive.

12. The method as claimed in claim 10, wherein, in addition to the conductive adhesive, the chip module is mechanically fixed in the card body by means of an adhesive bond.

13. The method as claimed in claim 1, wherein the connecting areas of the chip module are connected to the contact areas in an electrically conducting manner by means of a soldering process.

14. The method as claimed in claim 13, wherein, by means of the soldering connection, the chip module is at the same time mechanically fixed in the card body.

15. The method as claimed in claim 13, wherein, in addition to the soldering connection, the chip module is mechanically fixed in the card body by means of an adhesive bond.

16. The method as claimed in claim 1, wherein, apart from the connecting areas for the electrically conducting connection to the contact surfaces, the chip module used has areas which are arranged on the side of the chip module opposite from the connecting areas and serve for the physically contacting energy supply and/or data exchange with external equipment.

17. A chip card which is produced by the method as claimed in claim 1, which has at least:

a strip conductor carrier layer with strip conductors and metallic contact surfaces arranged on the strip conductor carrier layer, the strip conductor carrier layer being formed in the region of the metallic contact surfaces at least partly in a raised manner, with bump-like elevations being formed, and at least two covering layers, arranged on the strip conductor carrier layer and completely covering the strip conductors, the bump-like elevations of the strip conductor carrier layer being arranged in a positively locking manner in the region of the metallic contact surfaces in clearances of the covering layers at least partly at different heights in the cross section of the card body.

* * * * *